(12) United States Patent
Mehrotra et al.

(10) Patent No.: US 7,691,700 B2
(45) Date of Patent: Apr. 6, 2010

(54) MULTI-STAGE IMPLANT TO IMPROVE DEVICE CHARACTERISTICS

(75) Inventors: Manoj Mehrotra, Plano, TX (US); Stan Ashburn, McKinney, TX (US); Shaoping Tang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 193 days.

(21) Appl. No.: 11/769,058

(22) Filed: Jun. 27, 2007

(65) Prior Publication Data

US 2009/0004803 A1 Jan. 1, 2009

(51) Int. Cl.
*H01L 21/8238* (2006.01)
(52) U.S. Cl. .............. 438/227; 438/199; 257/E21.611; 257/E21.473
(58) Field of Classification Search .......... 438/199, 438/227; 257/E21.611, E21.473
See application file for complete search history.

(56) References Cited

U.S. PATENT DOCUMENTS

| | | | |
|---|---|---|---|
| 2002/0074597 A1* | 6/2002 | Ahmad et al. | 257/344 |
| 2002/0086490 A1* | 7/2002 | Fukada et al. | 438/373 |
| 2003/0166324 A1* | 9/2003 | Lin et al. | 438/302 |
| 2003/0218219 A1* | 11/2003 | Sohn et al. | 257/408 |
| 2004/0120209 A1* | 6/2004 | Lee et al. | 365/230.05 |
| 2007/0090462 A1* | 4/2007 | Wu et al. | 257/369 |

* cited by examiner

*Primary Examiner*—Thanh V Pham
*Assistant Examiner*—Maria Ligai
(74) *Attorney, Agent, or Firm*—Warren L. Franz; Wade J. Brady, III; Frederick J. Telecky, Jr.

(57) ABSTRACT

One aspect of the inventors' concept relates to a method of forming a semiconductor device. In this method, a gate structure is formed over a semiconductor body. A source/drain mask is patterned over the semiconductor body implanted source and drain regions are formed that are associated with the gate structure. After forming the implanted source and drain regions, a multi-stage implant is performed on the source and drain regions that comprises at least two implants where the dose and energy of the first implant varies from the dose and energy of the second implant. Other methods and devices are also disclosed.

17 Claims, 12 Drawing Sheets

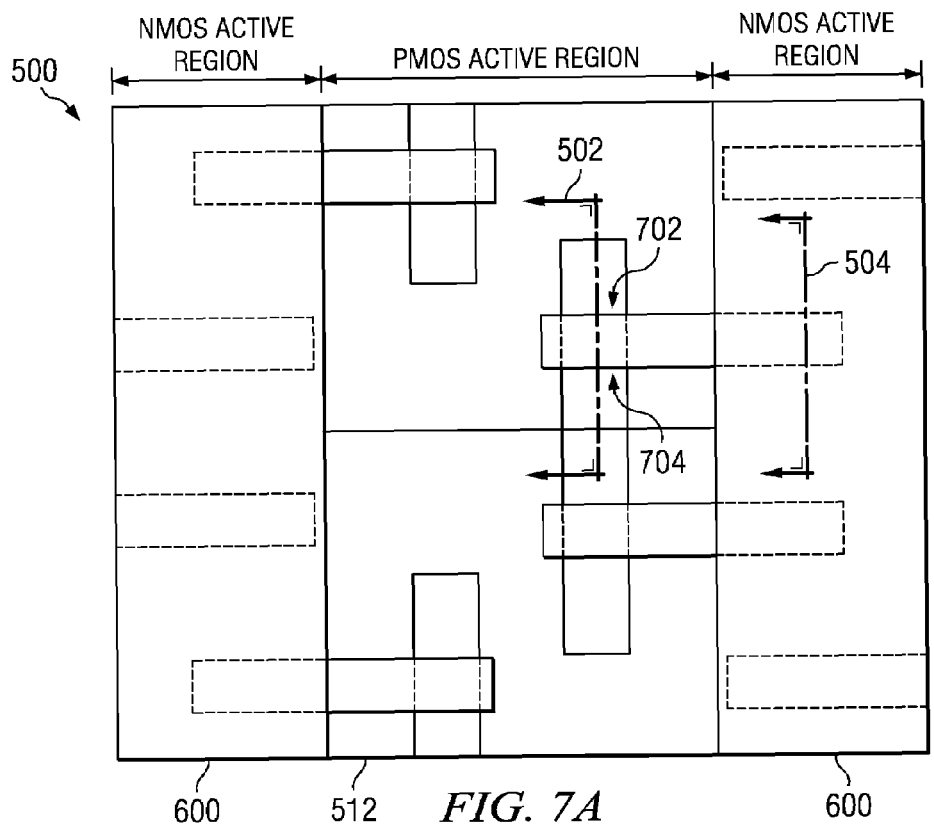
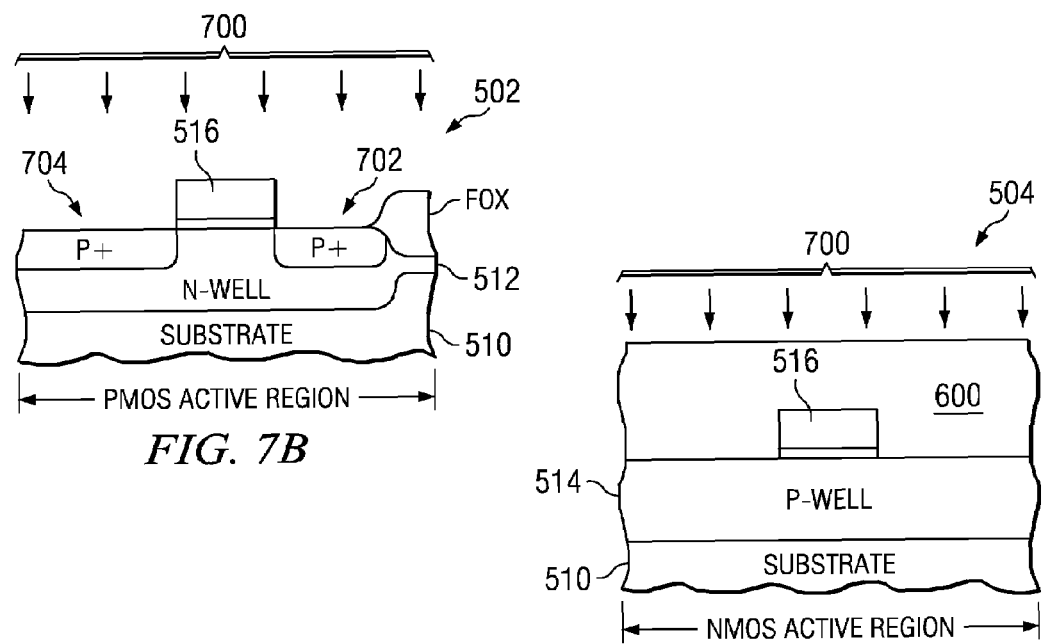

US 7,691,700 B2

MULTI-STAGE IMPLANT TO IMPROVE DEVICE CHARACTERISTICS

FIELD OF INVENTION

The present invention relates generally to semiconductor devices and processing thereof, and more particularly to improved device characteristics.

BACKGROUND OF THE INVENTION

Several trends presently exist in the semiconductor and electronics industry. One of these trends is that recent generations of portable electronic devices are using more memory than previous generations. This increase in memory allows these new devices to store more data, such as music or images, and also provides the devices with more computational power and speed.

Static random access memory (SRAM) is one type of memory that has increased its density and speed in successive generations, thereby facilitating more functional electronic devices. SRAM is typically arranged as an array of memory cells fabricated in an integrated circuit chip, and includes address decoding circuitry to allow access to each cell for read/write functions. These SRAM memory cells are often arranged in rows so that blocks of data such as words or bytes can be written or read simultaneously.

FIG. 1's SRAM memory cell 100A includes cross-coupled inverters 102, 104 that are configured to store a bit of datum through positive (e.g., reinforcing) feedback, such that the cell 100 can only assume one of two possible states, namely a "one" state or a "zero" state. Pass transistors 108, 110 selectively couple the cross-coupled inverters 102, 104 to a bitline (BL) and a complimentary bitline (bitline bar (BLB)). These bitlines can then communicate the bit of datum to and from the outside world. This arrangement is desirable for a memory cell since a state written to the cell will be retained until the cell is reprogrammed.

A WRITE of a "zero" to the illustrated cell 100B (FIG. 1B) is achieved by asserting the desired value on the BL and a complement of that value on BLB. While these values are presented on the bitlines, the WL is briefly asserted to enable the pass transistors 108, 110, thereby passing the values to the cross-coupled inverters. Because each inverter inverts (or flips) its input value, the cross-coupled inverters positively reinforce one another, thereby latching the desired data in the cell 100B.

A READ of the illustrated cell 100C (FIG. 1C) is affected by initially precharging both bitlines to a logical high state and then asserting the WL. In this case, one of the transistors of an inverter in the SRAM cell will pull one bitline lower than its precharged value (in FIG. 1C, BL is pulled low). A sense amplifier (not shown) detects the read current or the voltage differential between the bitlines to produce a logical "one" or "zero," depending on the internally stored state of the SRAM cell.

Because SRAM cells are often arranged in row-column format, the bitlines BL and BLB are typically coupled to multiple pass transistors associated with cells in a column of SRAM cells. Thus, when the bitlines are asserted to read or write to only a single row of cells, the pass transistors of the other unaccessed cells may also be subject to this bitline voltage. To keep the individual cells stable when they are not being accessed, it is desirable to keep the voltage thresholds Vt of the memory cell's transistors sufficiently high. In addition, it is desirable to have the cells provide a high enough read current for the sense amp to quickly sense whether a "one" or "zero" is stored in the cell. This may facilitate fast read times.

Accordingly, it would be desirable to have methods and devices that provide increased read current while keeping Vt, the voltage at which a transistor of the memory cell begins to conduct, sufficiently high; particularly where the transistors may be used in SRAM devices.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One aspect of the inventors' concept relates to a method of forming a semiconductor device. In this method, a gate structure is formed over a semiconductor body. A source/drain mask is patterned over the semiconductor body implanted source and drain regions are formed that are associated with the gate structure. After forming the implanted source and drain regions, a multi-stage implant is performed on the source and drain regions that comprises at least two implants where the dose and energy of the first implant varies from the dose and energy of the second implant.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIGS. 5-11 are views illustrating an SRAM cell at various stages of manufacture.

DETAILED DESCRIPTION OF THE INVENTION

Figure 1A:
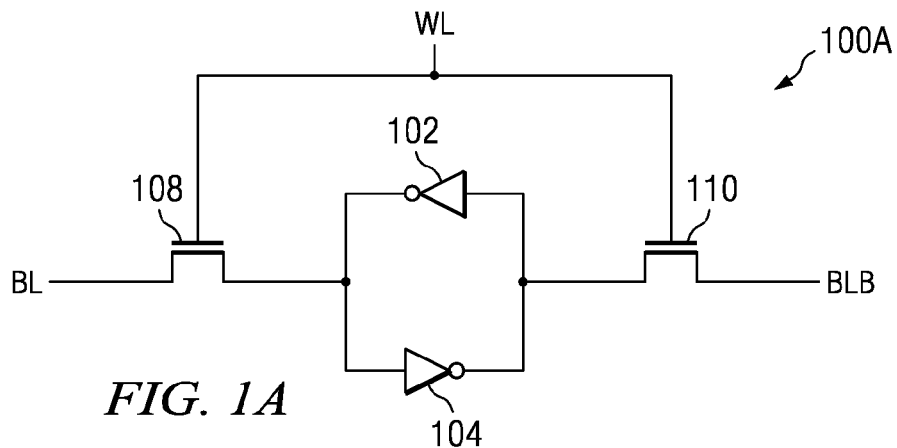
FIGS. 1A-1C is a schematic diagram of a static random access memory (SRAM) cell.
Figure 1B:
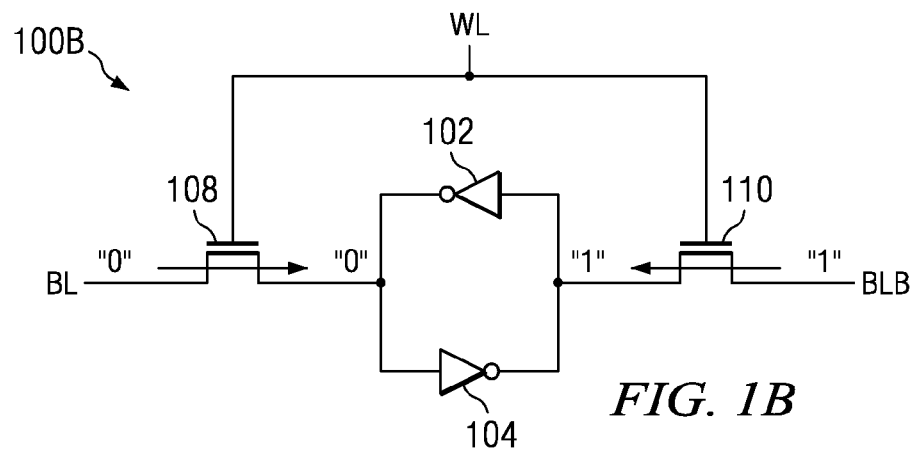
Figure 1C:
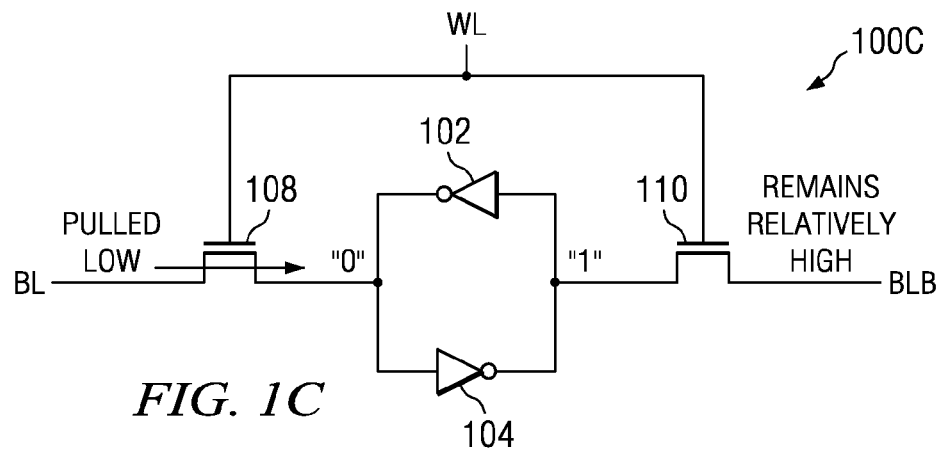

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. In other instances, known structures and devices are shown in block diagram form in order to facilitate describing one or more aspects of the present invention.

Figure 2:
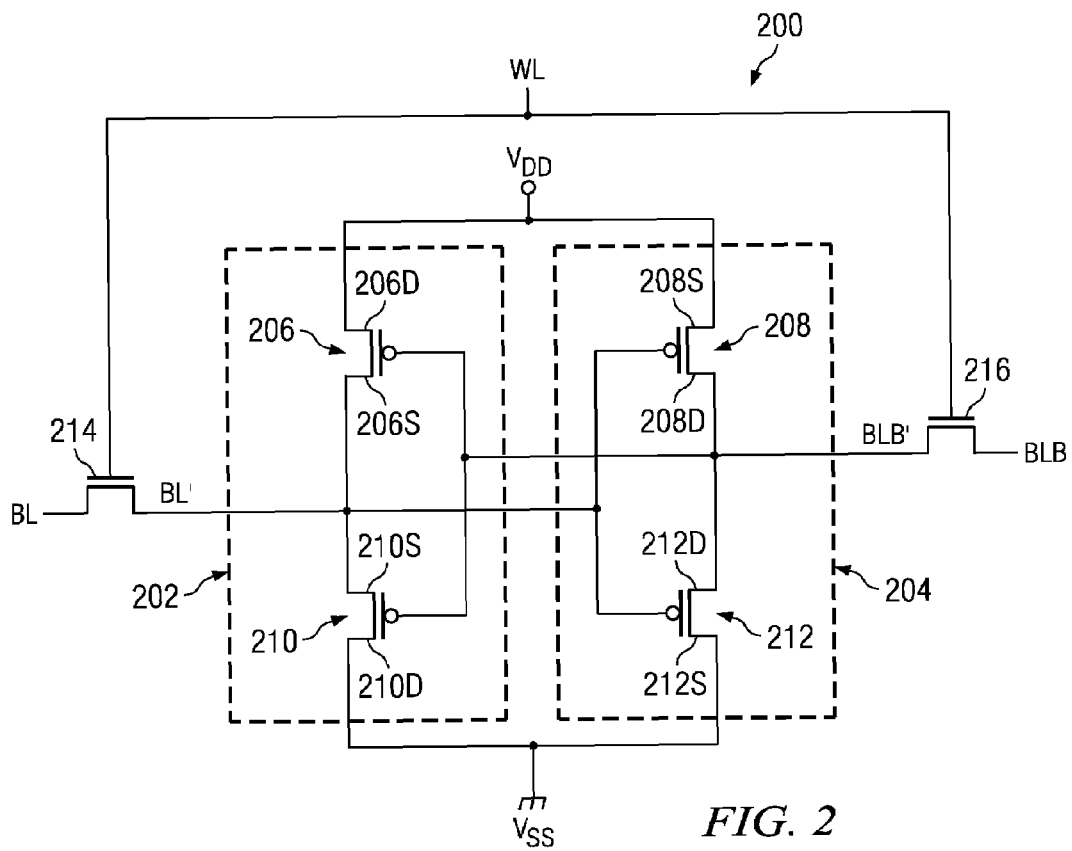
FIG. 2 is a schematic diagram of one embodiment of an SRAM cell.

FIG. 2 illustrates an exemplary SRAM memory cell 200 such as may be used in association with the present invention, and wherein several aspects of the invention are presented. As illustrated, the SRAM cell 200 generally comprises a pair of cross-coupled inverters 202, 204 to store a data bit state. Each inverter 202, 204 respectively comprises a p-type MOS (PMOS) load transistor 206, 208 and an n-type (NMOS) drive transistor 210, 212. Two pass transistors 214, 216 selectively couple the cross-coupled inverters 202, 204 to the bitlines BL, BLB. The pass transistors 214, 216 are generally n-type as well. This type of SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

In general, SRAM cells are more stable and have better data retention where the transistors can provide increased read current while still having sufficiently high Vt. In one technology, absent countermeasures, dopants tend to accumulate in the grain boundaries creating localized "hotspots" under the polysilicon gates. These hotspots tend to effectively lower the Vt of the transistors and reduce the read current the cell provides. In some instances, the hotspots may even "short" the gate to the source, drain, or channel region of the device, which can cause an error in one or more data bits stored in the SRAM cell.

To limit the effect of these hotspots, the NMOS pass transistors 214, 216 (and optionally the NMOS driver transistors 210, 212) receive a multi-stage implant to improve the read current without changing the Vt of these transistors. The multi-stage implant generally comprises any number of n-type implants performed on the source and drain regions of the transistors, where these implants are often carried out at different doses and different energies. The PMOS load transistors 206, 208 are typically masked during this procedure, and thus do not receive the multi-stage implant.

In one embodiment, the multi-stage implant may comprise a three-stage implant, where different energies and different doses are used at each stage. For example, in one embodiment, during the first stage, phosphorous ions could be implanted at an implantation energy of approximately 1 keV to approximately 3 keV, with a dose of approximately 1e15 atoms/cm$^3$ to approximately 3e15 atoms/cm$^3$. During a second stage, phosphorous could be implanted at an energy of approximately 3 keV to approximately 6 keV, with a dose of approximately 5e14 atoms/cm$^3$ to approximately 3e15 atoms/cm$^3$. During a third stage, phosphorous could be implanted at an energy of approximately 5 keV to approximately 7 keV, with a dose of approximately 1e14 atoms/cm$^3$ to approximately 1e15 atoms/cm$^3$.

By comparison, when only a single n-type source/drain implant is performed, it may cause the Vt of the implanted devices to drop, which is typically not acceptable. Because modern processes are carried out with lower thermal stresses (e.g., shorter anneals), the dopants in a single source/drain implant may not sufficiently diffuse to limit the hotspots. Therefore, a multi-stage implant allows the SRAM memory cells of the present invention to employ relatively low thermal stresses to be consistent with modern processes, while still sufficiently resulting in uniform and highly doped gates.

Figure 3A:
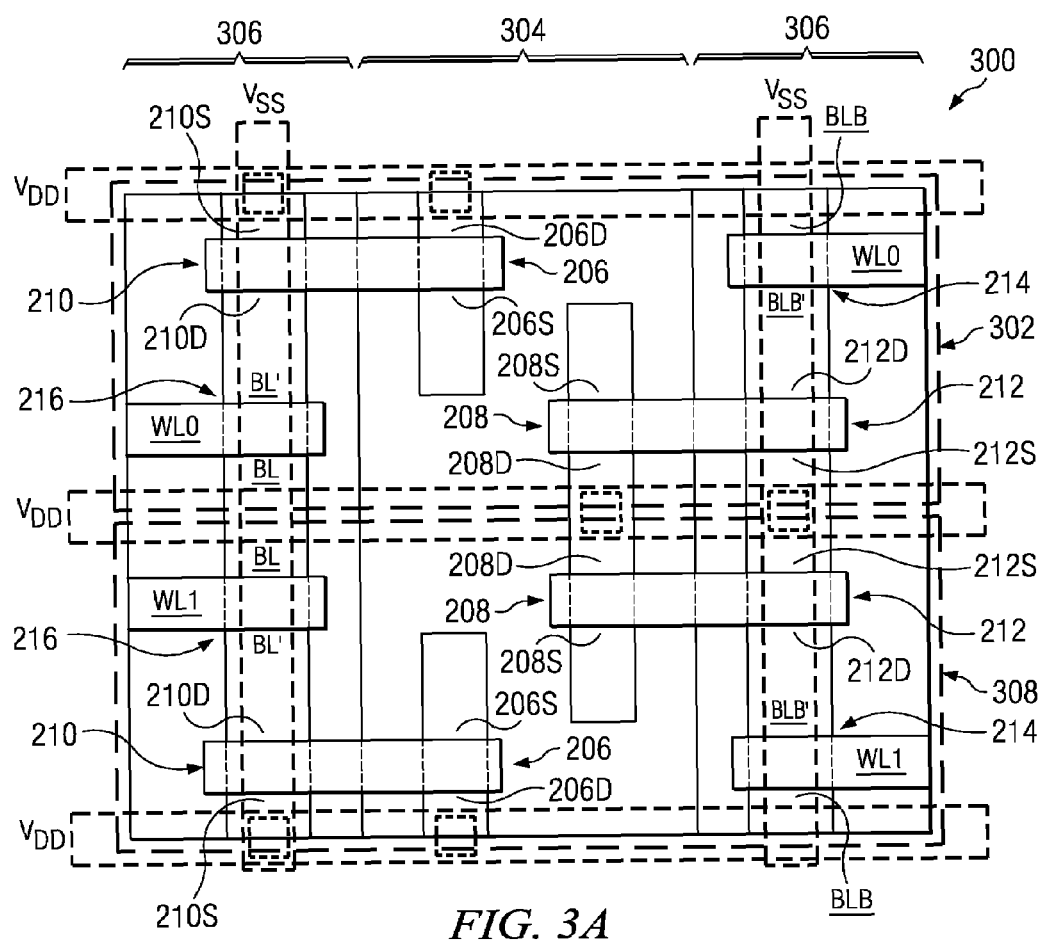
FIGS. 3A-3B are top layout views of one embodiment of an SRAM cell.
Figure 3B:
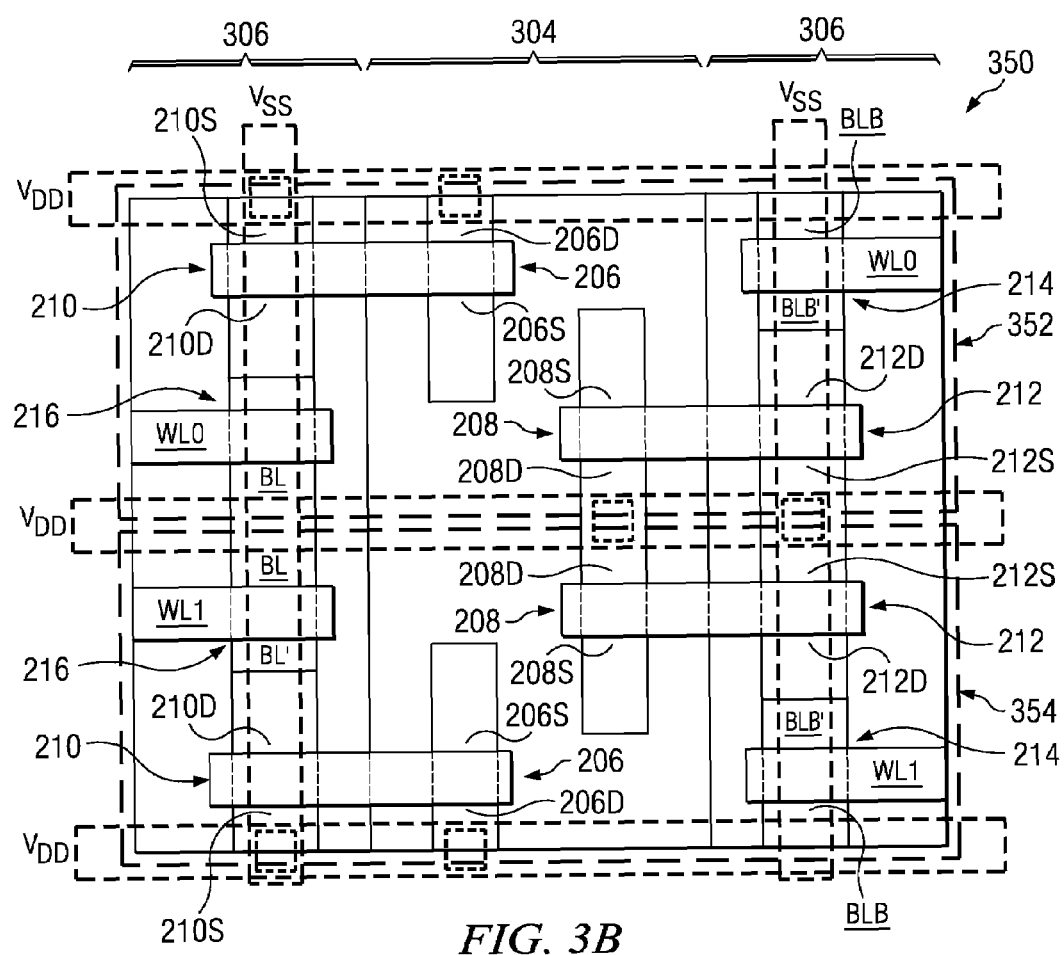

FIGS. 3A-3B each illustrates a top view of a sample SRAM layout 300, 350, where each figure shows two SRAM cells tiled together. It will be appreciated that there are countless layouts for implementing SRAM cells, and while FIGS. 3A-3B show one possible layout, aspects of the invention can extend to any other SRAM layout.

In FIGS. 3A-3B, the top SRAM cells 302, 352 include six transistors as previously discussed, namely: two PMOS load transistors 206, 208; two NMOS drive transistors 210, 212; and two NMOS pass transistors 214, 216. The PMOS transistors (e.g., 206) are formed within an n-well 304 or other n-type substrate, and have p-type source and drain regions (e.g., 206S, 206D) associated therewith. The NMOS transistors (e.g., 210) are formed within a p-well 306 or other p-type substrate, and have n-type source and drain regions (e.g., 210S, 210D). Wordlines (e.g., WL0) are typically formed at least partially in polysilicon, and may run perpendicular to the bitlines BL, BLB. Generally speaking, the bottom SRAM cells 308, 354 mirror the top SRAM cells 302, 352, respectively, and thus provide one example of how SRAM cells can be tiled together to form part of a memory array.

In these figures, the metal layers connecting the transistors have been omitted for purposes of readability, although the transistors of the individual SRAM cells can be coupled to one another to be consistent with FIG. 2 (e.g., load transistor 206 has a source (206S) that is coupled to drain (210D) of drive transistor 210, etc.).

In FIG. 3A's SRAM cell, the NMOS pass transistors 214, 216 have received the multi-stage implant (as indicated by the slashed shading), as have the NMOS drive transistors 210, 212 (also having slashed shading). In one embodiment, only SRAM memory cells in the memory array are subject to the multi-stage implant while all the other transistors on the IC are masked off. For example, in a stand-alone SRAM, the other masked off transistors could include the address decoder circuitry (both NMOS and PMOS transistors therein). In embedded SRAM, by contrast, the other masked off transistors could include logic circuitry transistors, for example.

In FIG. 3B, which shows a layout similar to FIG. 3A, the NMOS pass transistors 214, 216 have received the multi-stage implant (as indicated by slashed shading), but the NMOS drive transistors 210, 212 have not (as indicated by a lack of slashed shading). Thus, the transistors 214, 216, which have an adaptive n+" doping, would differ from transistors 210, 212, which have only n+ source/drain doping, in their poly grain size. More specifically, the poly grain sizes may differ as a function of the phosphorous doping and anneal.

Accordingly, turning to FIG. 4 and FIGS. 5-12, a somewhat general method 400 and a more detailed method 500 are illustrated and described. In these methods 400, 500, an SRAM memory cell is formed where a multi-stage implant is used to facilitate increased drive current without substantially changing the Vt of the implanted transistor. While the methods are illustrated and described below as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts depicted herein may be carried out in one or more separate acts or phases. Additionally, while the discussion herein is made with reference to SRAM, it is to be appreciated that one or more aspects of the present invention may have application to different types of memories and/or to other structures or circuits not illustrated or described herein.

Figure 4:
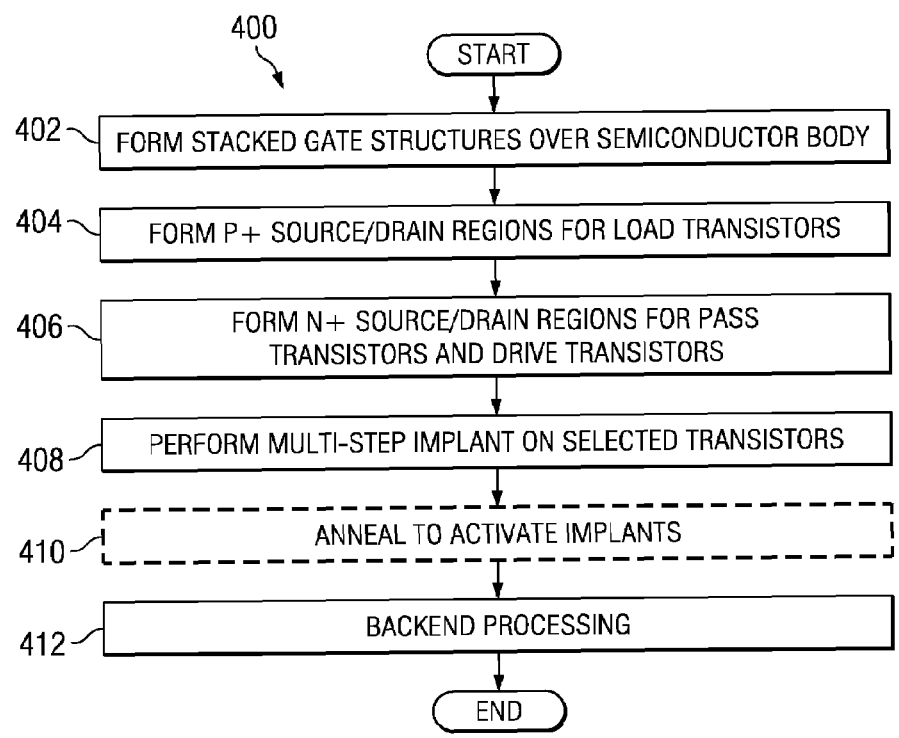
FIG. 4 is a flow diagram illustrating one embodiment of a method for manufacturing an SRAM cell.

Referring now to FIG. 4, one can see the somewhat generalized method for manufacturing an SRAM cell. In block 402, gate structures are formed over a semiconductor body. Next, in block 404, a p+ source/drain mask is patterned over the semiconductor body and p+ source/drain regions are formed for the PMOS load transistors. In block 406, the p+ source/drain mask is removed, and a n+ source/drain mask is patterned, after which n+ source/drain regions are formed for the NMOS pass transistors and NMOS drive transistors. In block 408, a multi-step implant is performed on selected transistors. For example, the selected transistors could include the NMOS pass transistors and optionally the NMOS drive transistors. Next, in block 410, a thermal anneal is performed to activate the implants. Lastly, in block 412, backend processing such as forming metal interconnects is performed to complete the SRAM cell.

Although FIG. 4 shows one somewhat general method, it will be appreciated that other methods are also contemplated by the present invention. For example, other SRAM cells could comprise PMOS load transistors, NMOS drive transistors, and PMOS pass transistors. Other embodiments are also possible.

Referring now to FIGS. 5-11, one can see a more detailed method for manufacturing an SRAM cell. Generally speaking, each of these figures shows an SRAM memory cell 500 at various stages of manufacture. More particularly, these figures show top-layout views (FIGS. 5A, 6A, 7A, etc.), and cross-sectional views of PMOS active regions (FIGS. 5B, 6B, 7B, etc.) and NMOS active regions (FIGS. 5C, 6C, 7C, etc.) taken along section lines 502 and 504, respectively. Some layers may not be shown in all of the figures for purposes of clarity and readability. For example, the top views do not explicitly show a field oxide layer (FOX), although the FOX layer is shown in the cross-sectional views.

Figure 5A:
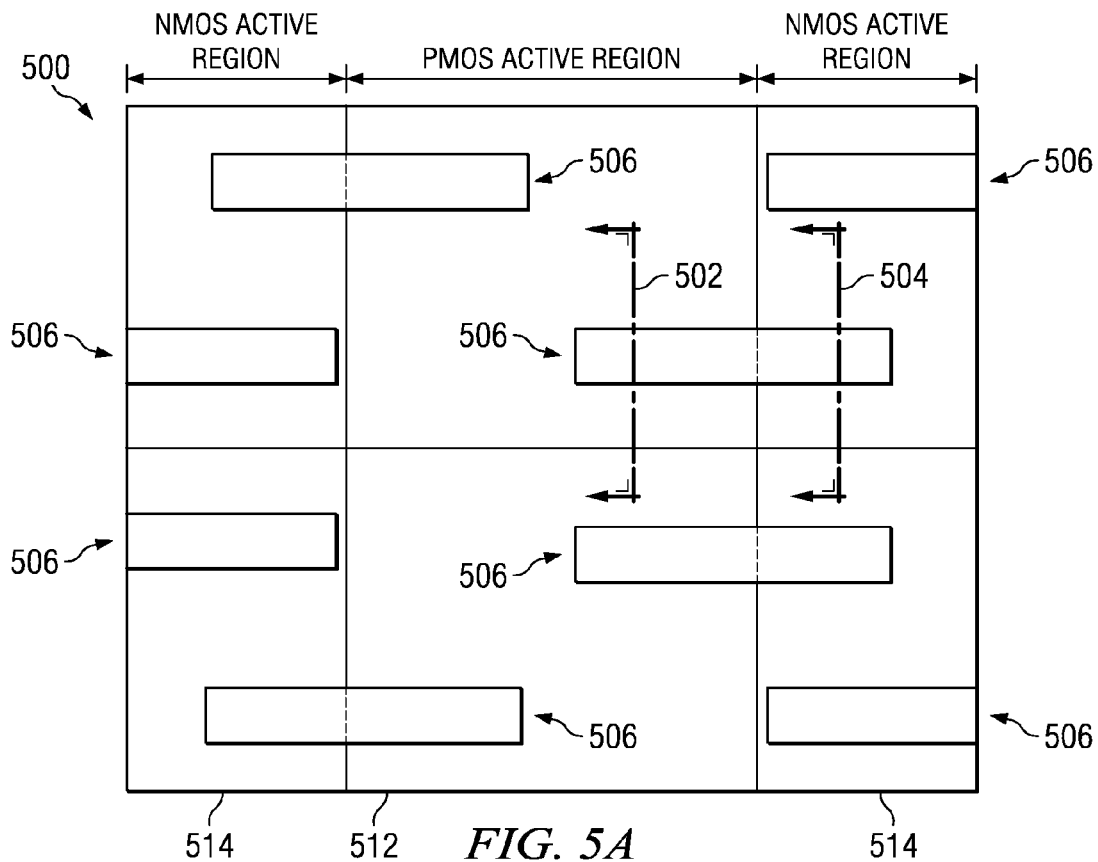
Figure 5B:
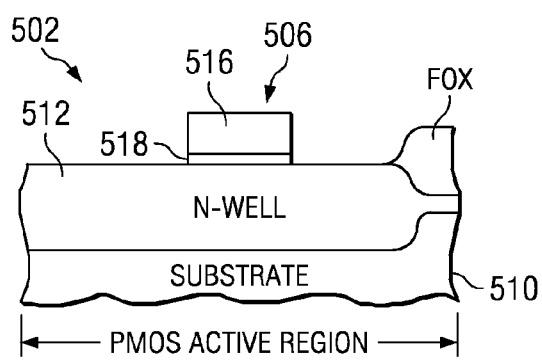
Figure 5C:
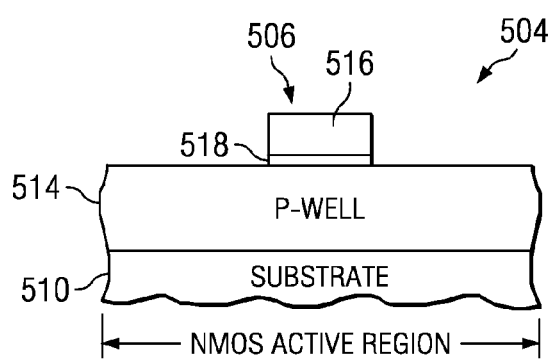

In FIGS. 5A-5C, gate structures 506 have been formed over a semiconductor body 508 that comprises a silicon substrate 510 having PMOS active regions and NMOS active regions. As shown in FIGS. 5B-5C, the active regions comprise an n-well 512 associated with the PMOS active region and a p-well 514 associated with the NMOS active region. The illustrated gate structures 506 include a gate electrode 516, which typically comprises polysilicon or metal. A thin dielectric 518 separates the gate electrode 516 from the active regions. In other embodiments (not illustrated), the gate structures could include spacers, or could include the gate dielectric of a multi-gate transistor (MUGFET), for example.

Figure 6A:
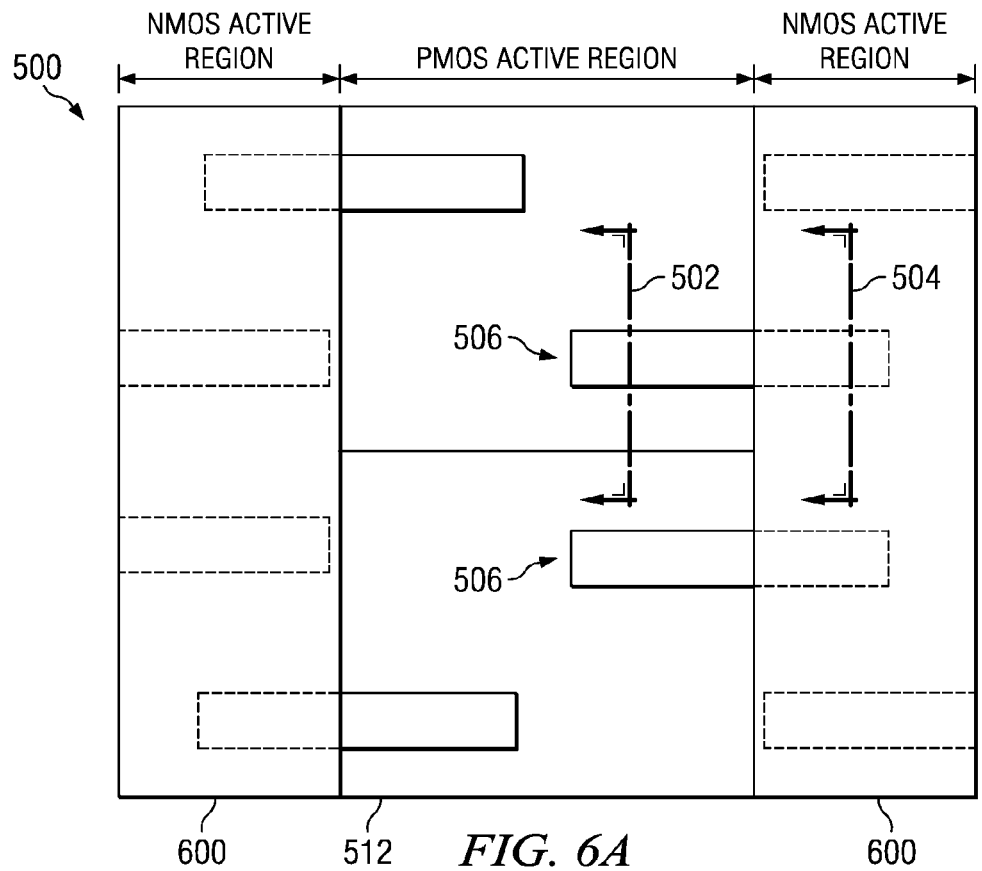
Figure 6B:
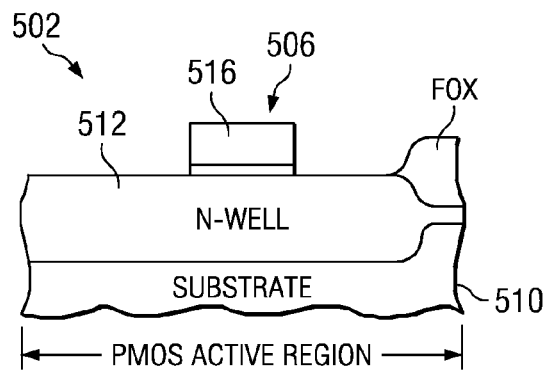
Figure 6C:
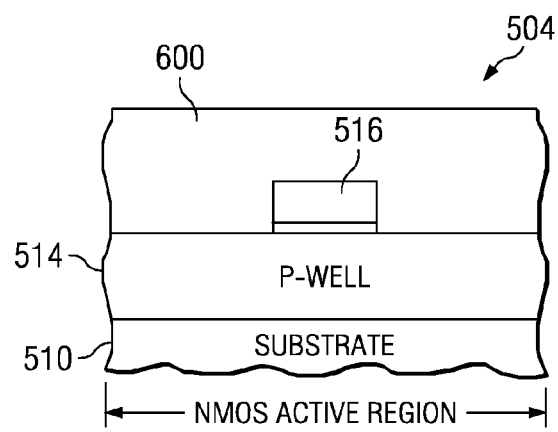

As shown in FIGS. 6A-6C, after the gate structures are formed, a PMOS source/drain mask 600 is patterned over the semiconductor substrate. In one embodiment, the PMOS source/drain mask 600 comprises photoresist and masks off the NMOS active region, while leaving the PMOS active region exposed though an open window 602 in the resist. Thus, FIGS. 6A-6C show the PMOS active region completely open and the NMOS active region completely masked off. In other embodiments, a hard mask, or some other suitable mask could be used in place of photoresist (the same is true of other masks described herein). Note that for ease of drawing/readability, the FOX is not shown in top view FIG. 6A, but is shown in the cross-sectional view FIG. 6B.

As shown in FIGS. 7A-7C, a p+ source/drain implant 700 is performed to form implanted source/drain regions 702, 704 in the n-well 512. Because the PMOS source/drain mask 600 covers the NMOS active region, the p-well 514 in the NMOS active region does not typically have p+ ions implanted therein due to this implant. The illustrated p+ source/drains 702, 704 are aligned with the FOX within the PMOS active region (i.e., the p+ implant does not penetrate through FOX), and the p+ source/drains are not necessarily aligned to the resist. In other embodiments, the p+ source/drains could be aligned with the resist and not necessarily with the FOX. In other embodiments, the alignment could be achieved in other manners.

Figure 8A:
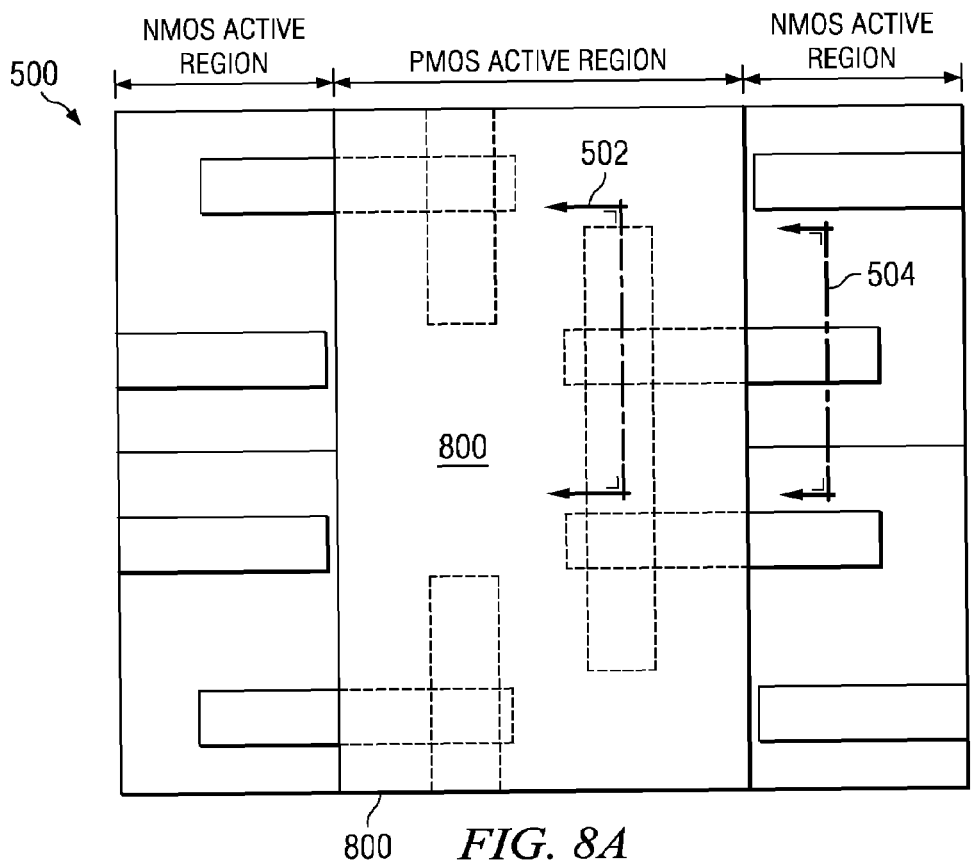
Figure 8B:
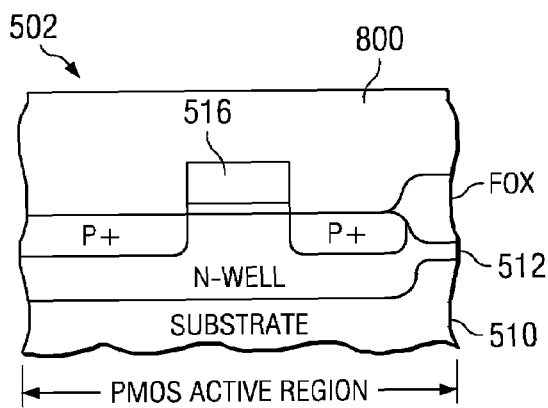
Figure 8C:
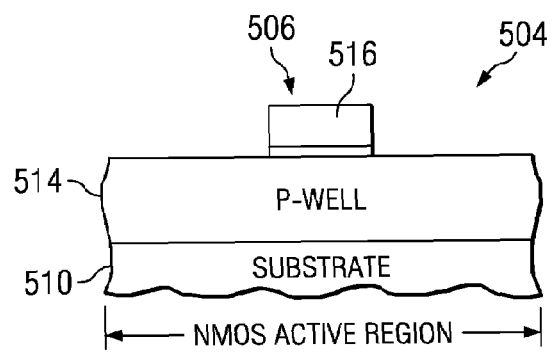

As shown in FIGS. 8A-8C, after the p+ source/drain implant is performed, the PMOS source/drain mask 600 may be removed and an NMOS source/drain mask 800 may be patterned. In one embodiment, the NMOS source/drain mask 800 comprises photoresist and masks off the PMOS active region, while leaving the NMOS active region exposed. Thus, typical NMOS source/drain masks are said to be complementary to the PMOS source/drain mask.

Figure 9A:
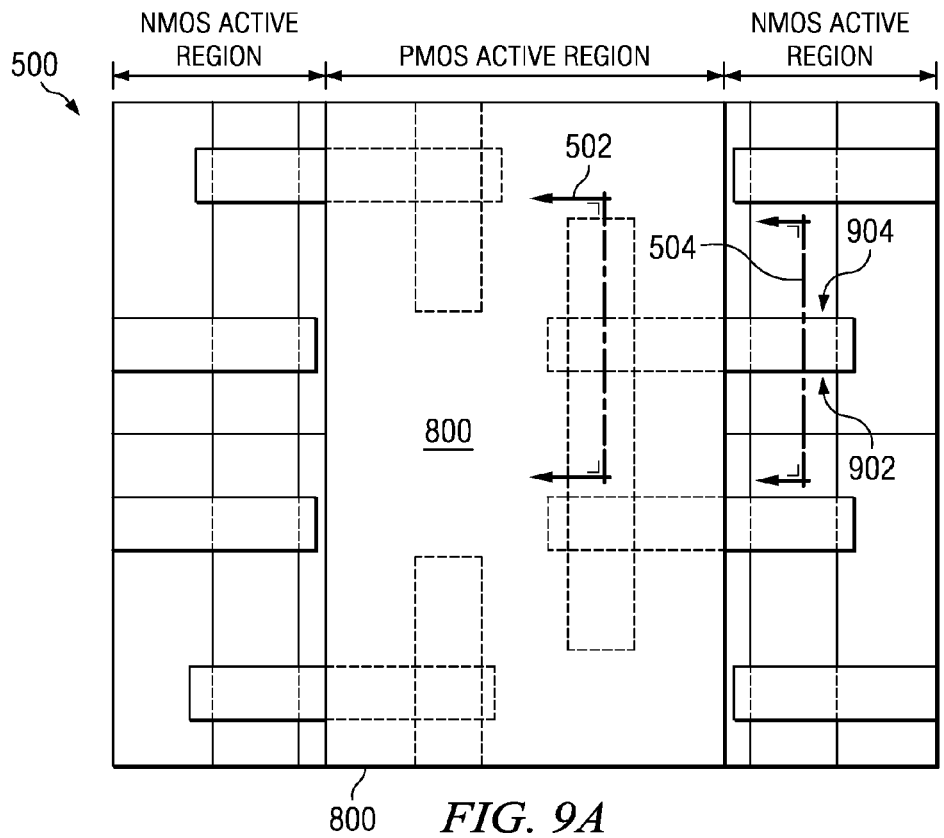
Figure 9B:
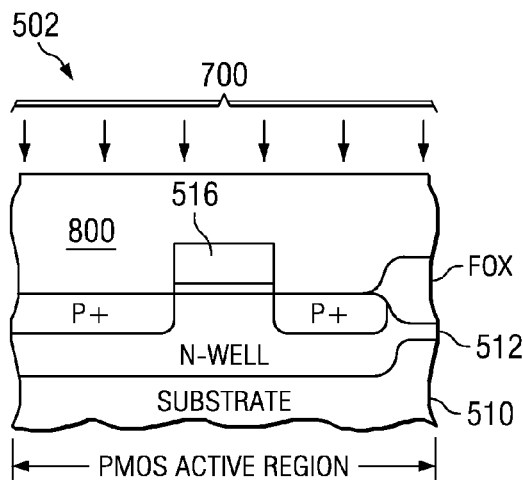
Figure 9C:
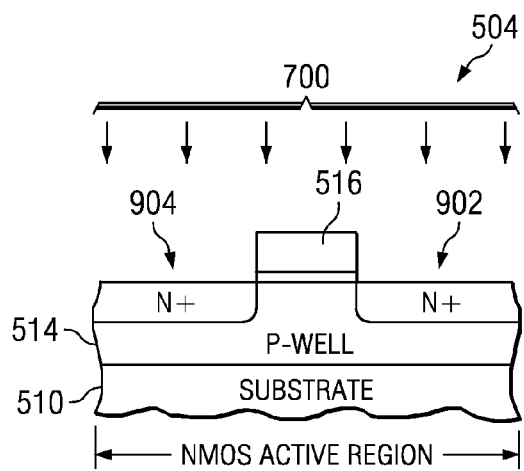

After the NMOS source/drain mask is patterned, an n+ source/drain implant 900 is performed to form implanted source/drain regions 902, 904 in the p-well 514 as shown in FIGS. 9A-9C. Because the NMOS source/drain mask 800 covers the PMOS active region, the n-well 512 in the PMOS active region does not typically have n+ ions implanted therein due to this implant.

Figure 10A:
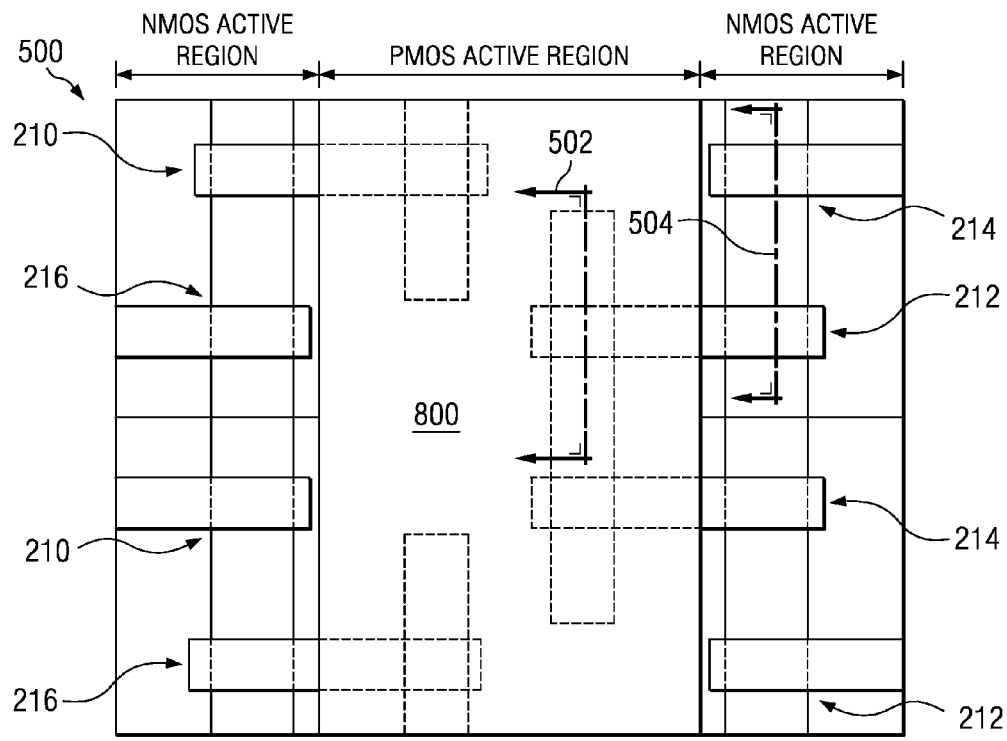
Figure 10B:
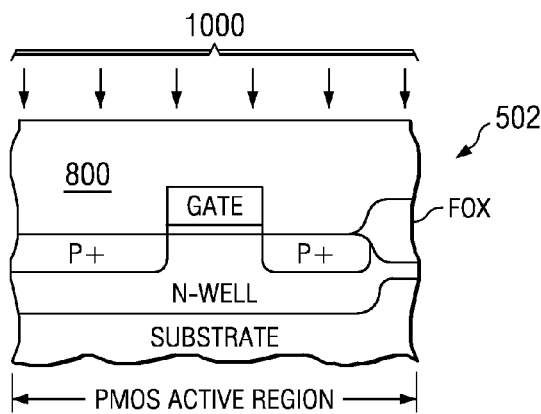
Figure 10C:
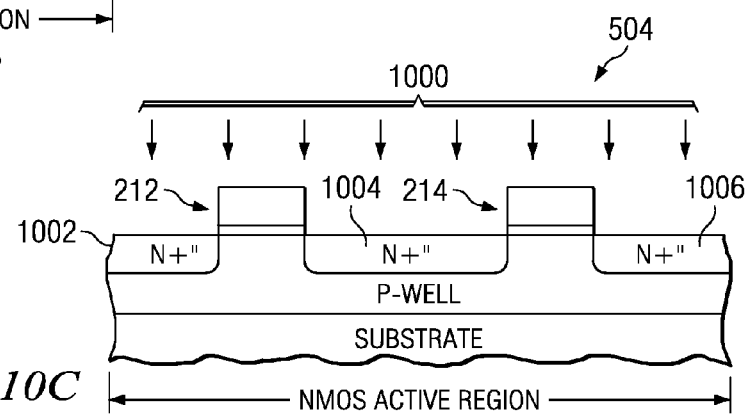

FIGS. 10A-10C show one embodiment where the NMOS drive transistors 210, 212 and NMOS pass transistors 214, 216 have been selected to receive a multi-stage n-type implant 1000 that formed adapted n+" source and drain regions (1002, 1004, 1006). In this embodiment, the multi-stage implant 1000 is performed while the NMOS source/drain mask 800 is still present. Therefore, the PMOS load transistors do not typically receive the multi-stage implant.

Although phosphorous could be used for the multi-stage implant in one embodiment, other dopants could also be used on the n-type devices in other embodiments. For example, some typical dopants are located in Table 15 of the periodic table. Thus, arsenic, antimony, nitrogen, or combinations of any of these dopants could also be used.

In some embodiments, the multi-stage implant could be a shadowing implant where the ions are implanted at a non-perpendicular angle relative to the surface of the substrate. This shadowing implant effectively gives more doping in the polysilicon gate and can help avoid shorting between the gate and active region.

Figure 11A:
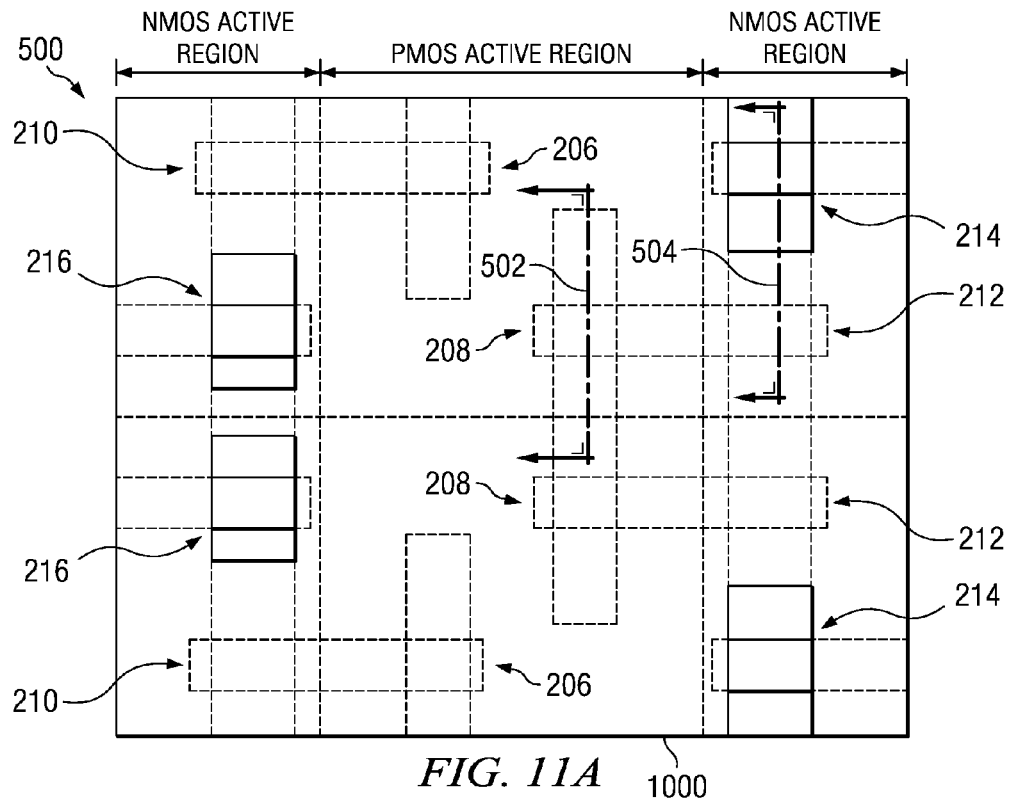
Figure 11B:
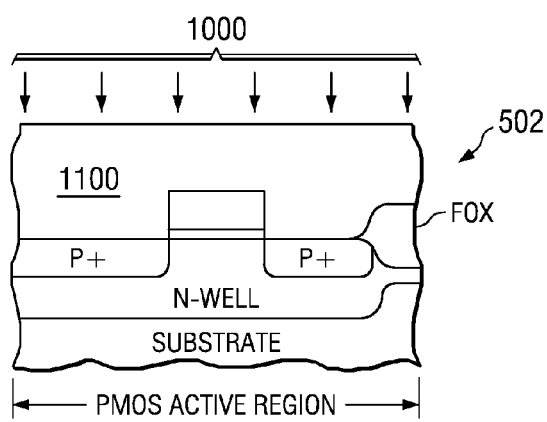
Figure 11C:
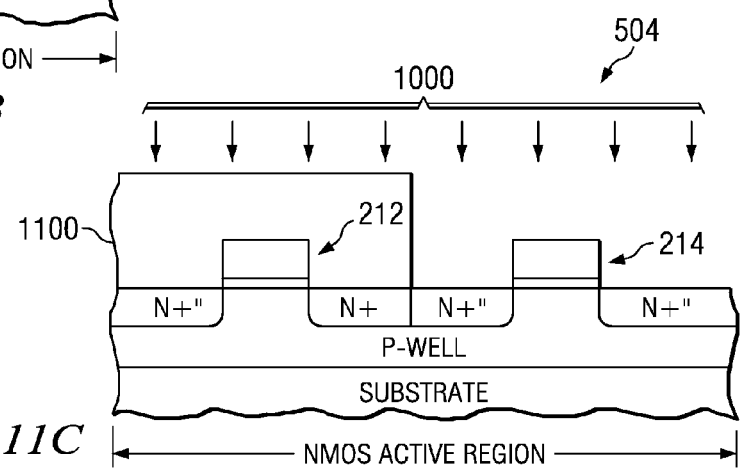

FIGS. 11A-11C show another embodiment where an additional mask 1100 has been patterned to select the NMOS pass transistors 214, 216 to receive the multi-stage n-type implant. In this embodiment, the multi-stage implant is performed while the additional mask 1100 masks the NMOS drive transistors 210, 212 and PMOS load transistors 206, 208.

Figure 12A:
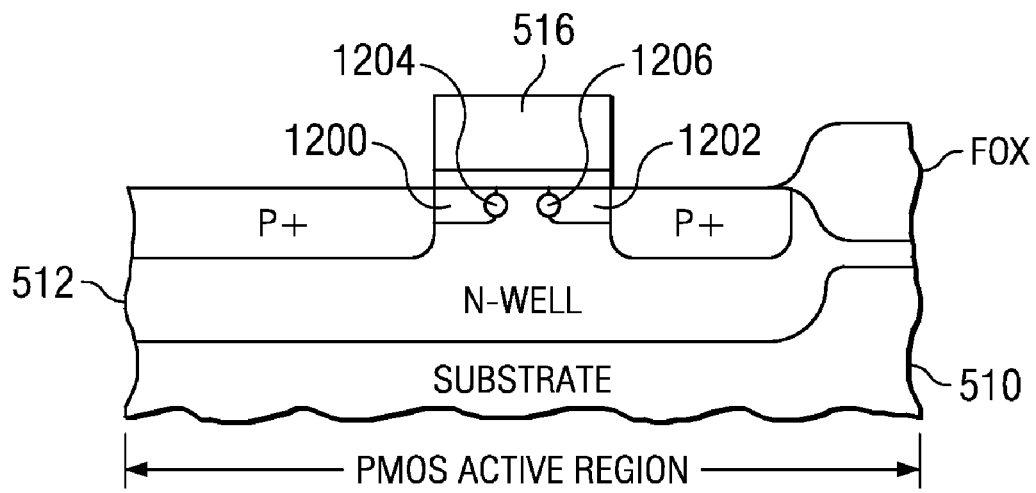
FIGS. 12A-12B are cross-sectional views illustrating source/drain extension regions.
Figure 12B:
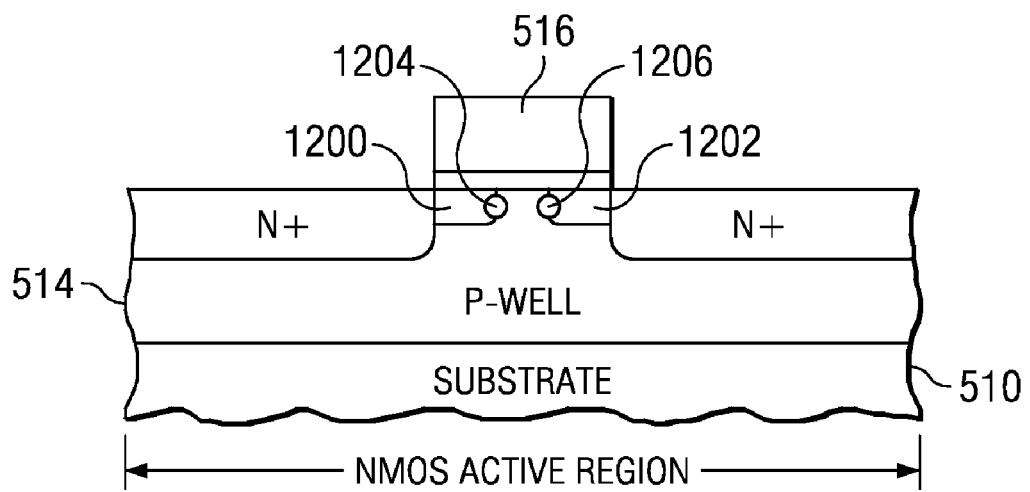

As shown in FIG. 12, various embodiments may include processing steps for forming source and drain extension regions 1200, 1202. These extension regions typically have the same type of doping conductivity as the source and drain regions (e.g., if the source/drains of a device are n-type, then the associated extension regions are also n-type). In comparison to the source and drain regions, the extension regions may be often relatively lightly-doped, but they may also be relatively highly-doped. In addition, various embodiments may include processing steps for forming pocket implant regions 1204, 1206. The pocket implant regions tend to be formed under the lateral edges of the gate by using an angled implant, and have a conductivity type that is opposite to that of the associated source and drain regions (e.g., if the source/drains of a device are n-type, the associated pocket implant regions are p-type). Spacers (not shown) could also be formed adjacent to the lateral edges of the gate in various embodiments.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, the layers can be formed in any number of suitable ways, such as with spin-on techniques, sputtering techniques (e.g., magnetron or ion beam sputtering), (thermal) growth techniques and/or deposition techniques such as chemical vapor deposition (CVD), for example.

What is claimed is:

1. A method of forming a semiconductor device, comprising:
    forming gate structures over at least two same type and at least one different type of PMOS or NMOS regions of a semiconductor body;
    patterning a first source/drain mask to mask off the at least two same type regions while leaving the at least one different type region exposed;
    performing a first implant through the first source/drain mask to form source and drain regions of a corresponding one p or n conductivity type associated with the gate structure in the at least one different type region;
    patterning a second source/drain mask to mask off the at least one different type region while leaving the at least two same type regions exposed;
    performing a second implant through the second source/drain mask to form source and drain regions of a corresponding other p or n conductivity type associated with the gate structures in the at least two same type regions;
    patterning a third source/drain mask to mask off the at least one different type region and at least one of the at least two same type regions while leaving at least one other of the at least two same type regions exposed; and
    performing a third implant through the third source/drain mask to provide additional doping of the corresponding other p or n conductivity type in the source and drain regions in the at least one other of the at least two same type regions; wherein the dose and energy of the third implant varies from the dose and energy of the second implant.

2. The method of claim 1, further comprising performing a fourth implant to provide yet additional doping of the corresponding other p or n conductivity type in the source and drain regions in the at least one other of the at least two same type regions; wherein the dose and energy of the fourth implant varies from the doses and energies of the second and third implants.

3. The method of claim 2, wherein the at least one other of the at least two same type regions is at least one NMOS region; and the second, third and fourth implants comprise implanting phosphorous into the at least one NMOS region at different implantation energies of approximately 1 keV to approximately 3 keV; approximately 3 keV to approximately 6 keV; and approximately 5 keV to approximately 7 keV.

4. The method of claim 2, wherein the at least one other of the at least two same type regions is at least one NMOS region; and the second, third and fourth implants provide doses of approximately 1e15 atoms/cm3 to approximately 3e15 atoms/cm3; of approximately 5e14 atoms/cm3 to approximately 3e15 atoms/cm3; and of approximately 1e14 atoms/cm3 to approximately 1e15 atoms/cm3.

5. The method of claim 1, wherein the source/drain masks comprise photoresist.

6. The method of claim 1, further comprising forming source and drain extension regions under the gate structures, which source and drain extension regions are respectively adjacent to and of the same conductivity type as the source and drain regions.

7. A method of forming a static random access memory cell, comprising:
    forming gate structures over regions a semiconductor body that are respectively associated with transistors of first and second conductivity types;
    patterning a first source/drain mask over the semiconductor body to expose the regions associated with the transistors of the first conductivity type and to cover the regions associated with the transistors of the second conductivity type;
    implanting a dopant of the first conductivity type through the first source/drain mask to form first source and drain regions in the exposed regions associated with the transistors of the first conductivity type;
    patterning a second source/drain mask over the semiconductor body to expose the regions associated with the transistors of the second conductivity type and to cover the regions associated with the transistors of the first conductivity type;
    implanting a dopant of the second conductivity type through the second source/drain mask to form second source and drain regions in the exposed regions associated with the transistors of the second conductivity type;
    selecting some, but not all, of the second source and drain regions; and
    performing at least some stages of a multi-stage implant of the second conductivity type on the some source and drain regions while masking to cover the first source and drain regions and others of the second source and drain regions.

8. The method of claim 7, wherein the multi-stage implant is performed while at least a portion of the second source/drain mask is over the semiconductor body.

9. The method of claim 8, wherein the second conductivity type is n type; and the multi-stage implant comprises at least two n-type implants at different doses and at different energies.

10. The method of claim 7, wherein the multi-stage implant comprises:
    implanting phosphorous at an implantation energy of approximately 1 keV to approximately 3 keV;
    implanting phosphorous at an implantation energy of approximately 3 keV to approximately 6 keV; and
    implanting phosphorous at an implantation energy of approximately 5 keV to approximately 7 keV.

11. The method of claim 7, wherein the selected second source and drain regions are in regions associated with n-type drive transistors and n-type pass transistors of the memory cell.

12. The method of claim 7, wherein the selected second source and drain regions are in regions associated with n-type pass transistors of the memory cell.

13. The method of claim 7, wherein the multi-stage implant is configured to increase current delivered by transistors associated with the selected source and drain regions while maintaining the voltage threshold of those transistors.

14. A method of forming a semiconductor device, comprising:
    forming gate structures over a silicon substrate having PMOS and NMOS active regions including an n-well associated with each PMOS active region and a p-well associated with each NMOS active region; each gate structure including a gate electrode, and a dielectric element separating the gate electrode from a corresponding active region;
    after forming the gate structures, patterning a PMOS source/drain mask over the semiconductor substrate to mask off the NMOS active regions, while leaving the PMOS active regions exposed;
    performing a p+ source/drain implant through the PMOS source/drain mask to form implanted source/drain regions in the n-wells;
    after the p+ source/drain implant is performed, removing the PMOS source/drain mask;
    patterning a first NMOS source/drain mask to mask off the PMOS active regions, while leaving the NMOS active regions exposed;
    performing a first phosphorous n+ source/drain implant through the NMOS source/drain mask to form implanted source/drain regions in the p-wells;
    patterning a second NMOS source/drain mask over the first NMOS source/drain mask to mask off the PMOS active regions and at least some of the NMOS active regions, while leaving remaining ones of the NMOS active regions exposed;
    performing a second phosphorous n+ source/drain implant through the first and second NMOS source/drain masks to provide additional doping in the implanted source/drain regions in the p-wells of the exposed remaining NMOS active regions;
    after the second phosphorous n+ source/drain implant is performed, removing the first and second NMOS source/drain masks.

15. The method of claim 14, wherein the gate electrodes are polysilicon; and the second phosphorous n+ source/drain implant comprises a shadowing implant wherein ions are implanted at a non-perpendicular angle relative to a surface of the substrate; the shadowing implant serving to provide more doping in the polysilicon gate.

16. The method of claim 14, further comprising:
    forming source/drain extension regions within the n-wells and p-wells using implants with a same type of doping conductivity as used for implanting the implanted source/drain regions;
    forming pocket implant regions within the n-wells and p-wells under lateral edges of the gate structures using angled implants with an opposite type of doping conductivity as used for implanting the implanted source/drain regions.

17. The method of claim 16, wherein the gate electrodes are polysilicon; and the second phosphorous n+ source/drain implant comprises a shadowing implant wherein ions are implanted at a non-perpendicular angle relative to a surface of the substrate; the shadowing implant serving to provide more doping in the polysilicon gate.

* * * * *